(12) United States Patent
Gellrich et al.

(10) Patent No.: US 8,854,602 B2
(45) Date of Patent: Oct. 7, 2014

(54) HOLDING DEVICE FOR AN OPTICAL ELEMENT IN AN OBJECTIVE

(75) Inventors: Bernhard Gellrich, Aalen (DE); Andreas Wurmbrand, Aalen-Reichenbach (DE); Jens Kugler, Heubach (DE); Armin Schoeppach, Aalen (DE); Christian Zengerling, Muehlhausen (DE); Stephane Bruynooghe, Aalen (DE)

(73) Assignees: ASML Netherlands B.V., Veldhoven, NB (NL); Carl Zeiss SMT GmbH, Oberkochen (DE)

( * ) Notice: Subject to any disclaimer, the term of this patent is extended or adjusted under 35 U.S.C. 154(b) by 2140 days.

(21) Appl. No.: 10/580,179

(22) PCT Filed: Nov. 22, 2004

(86) PCT No.: PCT/EP2004/013228
§ 371 (c)(1), (2), (4) Date: Apr. 24, 2007

(87) PCT Pub. No.: WO2005/054953
PCT Pub. Date: Jun. 16, 2005

(65) Prior Publication Data
US 2008/0002170 A1 Jan. 3, 2008

(30) Foreign Application Priority Data
Dec. 2, 2003 (DE) .................................. 103 56 730

(51) Int. Cl.
G03B 27/54 (2006.01)
G03B 27/68 (2006.01)
G03F 7/20 (2006.01)
G03B 27/52 (2006.01)
G03B 27/42 (2006.01)

(52) U.S. Cl.
CPC ........ *G03F 7/70891* (2013.01); *G03F 7/70808* (2013.01); *G03F 7/70341* (2013.01); *G03F 7/70825* (2013.01)
USPC ..................... 355/67; 355/30; 355/52; 355/53

(58) Field of Classification Search
USPC ........ 355/30, 53, 67–71, 77, 52, 55; 359/808, 359/811, 818, 819, 820; 250/492.1, 492.2, 250/492.22, 548
See application file for complete search history.

(56) References Cited

U.S. PATENT DOCUMENTS

| 4,433,897 A | * | 2/1984 | Kojima et al. | ............... 359/830 |
| 4,725,126 A | * | 2/1988 | Siga et al. | ..................... 359/819 |
| 4,983,251 A | | 1/1991 | Haisma | ........................ 156/630 |
| 5,054,683 A | | 10/1991 | Haisma | ........................ 228/198 |

(Continued)

FOREIGN PATENT DOCUMENTS

| CH | 663674 A5 | * 12/1987 |
| DE | 10200243 | 7/2003 |

(Continued)

*Primary Examiner* — Toan Ton
*Assistant Examiner* — Christina Riddle
(74) *Attorney, Agent, or Firm* — Wells St. John P.S.

(57) ABSTRACT

A holding device for an optical element in an objective has a mount that is connected to the objective, on the one hand, and at least indirectly to the optical element, on the other hand. Arranged between the mount and the optical element is a reinforcing element whose coefficient of thermal expansion corresponds substantially to the coefficient of thermal expansion of the optical element.

81 Claims, 5 Drawing Sheets

(56) References Cited

U.S. PATENT DOCUMENTS

| | | | | |
|---|---|---|---|---|
| 5,274,502 A | * | 12/1993 | Demerritt et al. | 359/642 |
| 5,446,591 A | * | 8/1995 | Medlock | 359/666 |
| 5,488,514 A | | 1/1996 | Bruning | 359/811 |
| 5,516,388 A | * | 5/1996 | Moran et al. | 156/89.14 |
| 5,729,393 A | | 3/1998 | Lee | 359/819 |
| 5,991,101 A | * | 11/1999 | Holderer et al. | 359/819 |
| 6,190,778 B1 | | 2/2001 | Batz-Sohn | 428/448 |
| 6,307,688 B1 | * | 10/2001 | Merz et al. | 359/819 |
| 6,388,823 B1 | * | 5/2002 | Gaber et al. | 359/819 |
| 6,392,824 B1 | * | 5/2002 | Holderer et al. | 359/819 |
| 6,417,974 B1 | | 7/2002 | Schuster | 359/754 |
| 6,627,468 B2 | | 9/2003 | Chiba | 438/24 |
| 6,724,548 B2 | | 4/2004 | Weber | 359/819 |
| 6,798,588 B2 | * | 9/2004 | Vogt | 359/819 |
| 6,829,107 B2 | | 12/2004 | Osterried | 359/811 |
| 6,867,848 B2 | | 3/2005 | Ebinuma | 355/75 |
| 6,879,379 B2 | * | 4/2005 | Brunotte et al. | 355/53 |
| 2001/0038500 A1 | * | 11/2001 | Shibazaki | 359/823 |
| 2001/0039126 A1 | * | 11/2001 | Ebinuma et al. | 438/795 |
| 2002/0021503 A1 | * | 2/2002 | Osterried | 359/819 |
| 2002/0167740 A1 | | 11/2002 | Osterried | 359/804 |
| 2003/0076602 A1 | * | 4/2003 | Nishikawa | 359/819 |
| 2003/0117596 A1 | * | 6/2003 | Nishi | 355/51 |
| 2003/0147155 A1 | * | 8/2003 | Nishikawa | 359/819 |
| 2004/0150802 A1 | | 8/2004 | Noehte | 355/67 |
| 2004/0174619 A1 | * | 9/2004 | Beck et al. | 359/819 |
| 2004/0233401 A1 | * | 11/2004 | Irie | 355/30 |
| 2005/0100745 A1 | * | 5/2005 | Lin et al. | 428/446 |
| 2005/0134972 A1 | * | 6/2005 | Kugler et al. | 359/811 |
| 2005/0225738 A1 | * | 10/2005 | Shirai | 355/53 |

FOREIGN PATENT DOCUMENTS

| | | |
|---|---|---|
| EP | 1279984 | 1/2003 |
| JP | 58090605 A * | 5/1983 |
| JP | 58202448 | 11/1983 |
| WO | WO 02093257 A2 * | 11/2002 |

* cited by examiner

HOLDING DEVICE FOR AN OPTICAL ELEMENT IN AN OBJECTIVE

CROSS REFERENCE TO RELATED APPLICATION

This is a 35 U.S.C. §371 application of and claims priority to PCT International Application Number PCT/EP2004/013228, which was filed Nov. 22, 2004, and which claims priority to both German Patent Application No. 103 56 730.5, filed Dec. 2, 2003, and U.S. application Ser. No. 10/719,683, filed Nov. 24, 2003, and the teachings of all the applications are incorporated herein by reference.

The invention relates to a holding device for an optical element in an objective. The invention also relates to an objective, to a lithographic apparatus and to a method for connecting an optical element and a reinforcing element in an objective.

A holding device for an optical element, designed as a terminating element, in an objective, in this case in a lithography objective, and a corresponding lithography objective are known from the prior art. In order in the case of such a projection objective to provide a non-adhesive connection between an optical element with the associated mount or a part connected to the mount, an optical accuracy of mating shape between the optical element to be exchanged and the mount or the part connected to the mount is set by means of surface mating. Such holding devices for terminating elements are suitable in principle for customary applications in lithography.

In an alternative solution, the plates are bonded to the mount, it being possible to use an annular blade support for a three-point bearing. Soft rubber adhesive or cement are used to balance the different coefficients of thermal expansion of the optical material and material of the mount. In the case of the so-called glass-hard bonding, this balancing is performed by mechanical spring elements between the optical element and the mount.

Reference is made as regards the prior art to the documents US 2002/0167740 A1, EP 1 279 984 A1, US 2002/0021503 A1, or to US 2001/0039126 A1.

However, when a lithography objective is to be used, for example, for immersion lithography described in EP 0 023 231 B1 mounting techniques applied in conventional "dry" lithography are unsuitable. Thus, the terminating element and the immersion medium in which the same is located, preferably a liquid, already acts like a lens in the case of the slightest deformations, since the compensation effects occurring in the case of customary lithography objectives because of the air-glass-air assembly are eliminated. This holds the more so since the terminating element is optically active and, moreover, mostly has a relatively small thickness. As a result, the terminating element has a clearly closer deformation tolerance to fulfill, fluctuations the gas pressure upstream of the terminating element, as well as in the liquid pressure downstream of the terminal element being able to lead to further deformations. Since it is natural that the sealing requirements placed on the connection between the terminating element and the mount are clearly greater in the case of immersion lithography than of conventional lithography, the forces that are required for such a sealing therefore rise and this, in turn, increases the potential deformation of the terminating element.

A further problem occurring in the use of known lithography objectives in immersion lithography consists in that the terminating element and the mount have substantially different coefficients of thermal expansion and, in the case of temperature fluctuations in the immersion medium and/or the surroundings, as well as because of the heat produced by the laser radiation, this likewise leads to deformations in the terminating element and thus to a reduction in the imaging accuracy.

A lithographic apparatus is a machine that applies a desired pattern onto a target portion of a substrate. Lithographic apparatus can be used, for example, in the manufacture of integrated circuits (ICs). In that circumstance, a patterning means, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable und unpredictable effects. Also, the optical properties, in particular the geometrical optical properties of the elements of the projection system must remain constant.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504. Liquid is supplied by at least one inlet onto the substrate, preferably along the direction of movement of the substrate relative to the final element, and is removed by at least one outlet after having passed under the projection system. Another solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member an the surface of the substrate. Preferably the seal is a contactless seal such as a gas seal. Such a system is disclosed in European Patent Application No. 03252955.4.

However, the presence of fluid around the bottom of the projection system has been found to deform the elements concerned leading to degradation of the exposure. The liquid also enters the projection system which can damage or deform delicate parts of the apparatus over time.

U.S. Pat. No. 6,190,778 discloses a method of bonding silicon objects using organic compounds. U.S. Pat. No. 4,983,251 discloses a bonding method without an intermediate layer, called direct bonding, an then annealing. U.S. Pat. No. 5,054,683 describes a method of bonding in which there is a connecting layer containing boron. The two bodies, together with the connecting layer are pressed together an heat treated to bond them.

It is an object of the present invention to create a holding device for an optical element in an objective that is particularly, but not exclusively, suitable for fulfilling the requirements placed on a lithography objective in immersion lithography as regards the deformation of the optical element and the imaging accuracy resulting there from.

According to the invention, this object is achieved by a holding device for an optical element in an objective, having a mount that is connected, on the one hand, to the objective and, on the other hand, at least indirectly to the optical element, there being arranged between the mount and the optical element a reinforcing element whose coefficient of thermal expansion corresponds substantially to the coefficient of thermal expansion of the optical element.

In accordance with the present invention, there is arranged between the mount and the optical element a reinforcing element that advantageously ensures a substantial reinforcement of the holding device according to the invention and thus contributes to holding the optical element rigidly and securely such that no deformation of the same is to be expected owing to the forces occurring in immersion lithography.

By virtue of the fact that, in accordance with the invention, the reinforcing element has a coefficient of thermal expansion that substantially corresponds to the coefficient of thermal expansion of the optical element, no differences arise with reference to the expansion of the two components in the case of a change in the temperature of the immersion medium, or in the case of the action of the laser radiation. As a result, the optical element is decoupled from the mount, and the problem of the different thermal expansion outlined above is moved to another point inside the objective at which its effects are very much slighter.

Moreover, the reinforcing element according to the invention offers a very good possibility for sealing the objective off from the immersion medium. Thus, in an advantageous refinement a seal or gasket is arranged between the optical element and the reinforcing element.

A particularly simple possibility for implementing the at least approximately identical coefficient of thermal expansion of the reinforcing element and the optical element and consists in that the reinforcing element and the optical element are composed of the same material.

In a further advantageous refinement of the invention, it can further be provided that the reinforcing element and the optical element are connected to one another by a wrung connection. Firstly, this constitutes a possibility of connection between the reinforcing element and the optical element that is very easy to implement and, secondly, also ensures, if appropriate even without the abovementioned sealing device, a very good tightness between the optical element and the reinforcing element such that the immersion medium cannot penetrate into the objective.

Furthermore, it can be provided in order to improve the tightness of the wrung connection that contact surfaces of the optical element and of the reinforcing element are treated with a chemically activating liquid before wringing and are exposed to a temperature of more than 150° C. after the wringing.

The tightness of the wrung connection is increased when, in an advantageous development of the invention, the optical element and/or the reinforcing element are provided with a protective layer in the region of the wrung connection.

In order to avoid possible degassing of the immersion medium penetrating into the objective, it is possible to provide in a further advantageous development of the invention that a seal or gasket is arranged between the mount and the reinforcing element. The seal or gasket can thereby be arranged in such a way that contact of the same with the immersion medium is avoided.

An objective having an optical element and having a holding device for the optical element having a mount that is connected, on the one hand, to the objective and, on the other hand, at least indirectly to the optical element, there being arranged between the mount and the optical element a reinforcing element whose coefficient of thermal expansion corresponds substantially to the coefficient of thermal expansion of the optical element is specified in claim 24.

In claim 32 a lithographic apparatus comprising an illumination system for providing a projection beam of radiation, a support structure for supporting patterning means, a substrate table for holding a substrate, and a projection system for projecting the patterned beam onto a target portion of the substrate, the projection system comprising an objective having an optical element and having a holding device for the optical element having a mount that is connected, on the one hand, to the objective and, on the other hand, at least indirectly to the optical element, there being arranged between the mount and the optical element a reinforcing element whose coefficient of thermal expansion corresponds substantially to the coefficient of thermal expansion of the optical element is claimed.

A method for connecting an optical element and a reinforcing element in an objective, in which the optical element and the reinforcing element are connected to one another by wringing emerges from claim 33.

A method of manufacturing semiconductor components by using a lithography objective according to claim 32 is given in claim 38.

Further advantageous refinements of the invention follow from the remaining dependent claims. Exemplary embodiments of the invention are described below in principle with the aid of the drawing.

Figure 1:
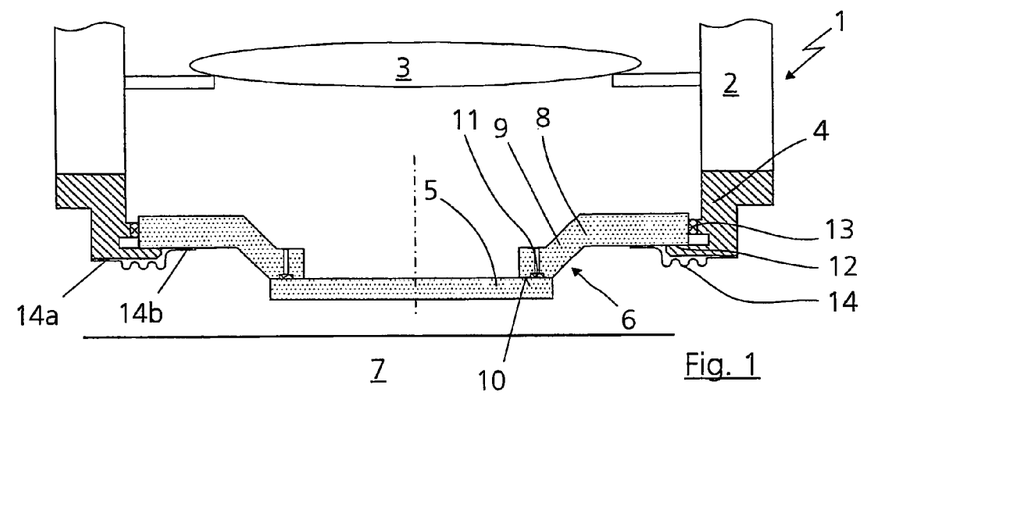
FIG. 1 shows a first embodiment of an objective according to the invention and having a holding device according to the invention.

FIG. 1 shows a first embodiment of an objective that is designed as a lithography objective 1 and is suitable, in particular, for immersion lithography, but can also be used for other types of lithography and also for other purposes. Since immersion lithography is known per se, this method will not be examined in more detail herein. The lithography objective 1 has a housing 2, which is indicated very schematically and inside which there are arranged in a way known per se in a plurality of optical elements 3 whose number and arrangement are, however, to be regarded merely as exemplary.

Fitted on the underside of the housing 2 is a basic structure or mount 4 that can, for example, be screwed to the housing 2 by means of threads (not illustrated), in order to be connected to said housing removably. Of course, it is also possible to conceive other types of a connection of the mount 4 to the housing 2 with the aid of which the mount 4 can be removed from the housing 2. The mount 4 serves for accommodating a terminating plate or a terminating element 5 that is held in the mount 4 by means of a holding device 6 described in more detail below, and that seals off the lithography objective 1 downward from an immersion medium 7. Instead of being used for the terminating element 5, the holding device 6 can also be used quite generally for an optical element.

Arranged between the mount 4 and the terminating element 5 as part of the holding device 6 is a connecting and/or reinforcing element 8 that makes the connection of the terminating element 5 to the mount 4. The reinforcing element 8, which has a crank 9 for the purpose of achieving a spacing in the z- or axial direction of the terminating element 5 from the mount 4, ensures that the terminating element 5 is fitted stiffly on the mount 4.

In order not to transmit to the mount 4 any possible transmission of heat from the immersion medium 7 onto the terminating element 5, the reinforcing element 8 also has a coefficient of thermal expansion that corresponds substantially to the coefficient of thermal expansion of the terminating element 5. In order to realize this in as simple a way as possible, the reinforcing element 8 preferably consists of the same material as the terminating element 5. In the case of lithography objectives 1, which operate in the DUV region (that is to say 248 nm), in the VUV region (that is to say 193 nm) or in the 157 nm region, the material used for the terminating element 5 and the reinforcing element 8 substantially is quartz ($SiO_2$) or calcium fluoride ($CaF_2$). When the terminating element 5 substantially consists of $CaF_2$, it is also possible to use brass, for example, for the reinforcing element 8, since this material has a very similar coefficient of thermal expansion to that of calcium fluoride. In any event, a material that is resistant to the immersion medium 7 should be used for the terminating element 5 and the reinforcing element 8. A liquid, for example water, is preferably used as immersion medium.

Figure 6A:
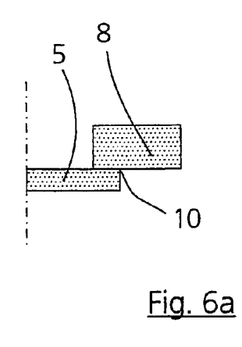
FIGS. 6a, 6b, 6c show various geometries of a wrung connection between the optical element and the reinforcing element.
Figure 6B:
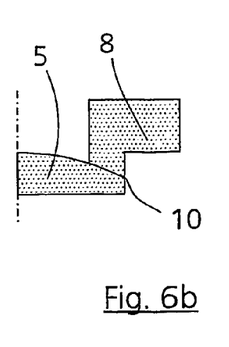
Figure 6C:
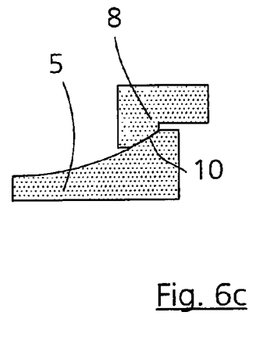

The terminating element 5 is connected to the reinforcing element 8 by a wrung connection 10, the possible geometries of this wrung connection 10 being examined in more detail in FIGS. 6a, 6b and 6c. The wrung connection 10, which can be produced in a way known per se, already yields a very good tightness of the connection between the connecting element 5 and the reinforcing element 8, in particular when the two wringing partners, that is to say the reinforcing element 8 and the terminating element 5 are treated for wringing with a chemically activating liquid and are exposed after wringing to a temperature of more than 50°. In order further to improve this tightness, a seal or gasket 11 is arranged between the terminating element 5 and the reinforcing element 8 in the case of the embodiment illustrated. The seal 11 ensures, in addition to the wrung connection 10, that there is a tightness in the adhesion gap between the terminating element 5 and the reinforcing element 8, and prevents the immersion medium 7 from penetrating even in the case of a possible capillary action in the adhesion gap. This is preferably a seal 11 that exhibits no reaction with the immersion medium 7, and has the slightest possible swelling. The seal 11 preferably has a coefficient of thermal expansion approximately identical to that of the terminating element 5 and the reinforcing element 8. The seal 11 can be arranged both on the inner side, on the outer side and also on both sides of the wrung connection 10. If appropriate, the seal 11 can also be a separate part such as, for example, a sealing ring or gasket. The wrung connection 10 and/or the seal 11 in this case also ensure that the lithography objective 1 is gas-tight.

Also conceivable as an alternative to the wrung connection 10 is a connection of the terminating element 5 to the reinforcing element 8 by means of bonding and/or soldering, a solder that is as low melting as possible requiring to be used in the case of soldering. The wrung connection 10 is gas-tight and substantially insensitive to contact with the immersion medium 7, and so any possible additional safety bonding on the inner side of the wrung connection 10 is adequately protected. Both the wrung connection 10 and the soldered connection (not illustrated) are a hard connection of the terminating element 5 with the reinforcing element 8, no problems arising with reference to possible transmission of forces, because of the substantially identical coefficients of thermal expansion of the terminating element 5 and the reinforcing element 8.

In a way not illustrated, the terminating element 5 and the reinforcing element 8 could also be designed in one part with one another, that is to say there could be a single, monolithic component that, on the one hand, could ensure the actual functioning of the terminating element 5, specifically the termination of the lithography objective 1 in the direction of the immersion medium 7, and, on the other hand, could ensure that the terminating element 5 is fitted rigidly on the mount 4. This would require the optical surface, that is to say the section formed by the terminating element 5, to have a sufficiently small thickness, whereas the section, formed by the reinforcing element 8, of such a component would need to be designed such that the rigidity of the optical surface was ensured.

The mount 4 preferably consists of a metallic material such as high-grade steel, for example. Alternatively, the mount 4 can also consist of other materials known in optical engineering such as ceramic, Invar, Zerodur, brass and other metallic alloys. The differences between these materials, as well as the individual advantages are known per se, and for this reason will not be examined in further detail here. It is, of course, to be preferred when the material of the mount 4 matches that of the material of the housing 2 in terms of its properties.

The reinforcing element is supported inside the mount 4 by means of a plurality of elastic support points 12, three support points 12 preferably being present. Spring elements, for example, can be used as elastic support points 12. Elastic embedding with the aid of a multiplicity of very soft spring elements is also conceivable. In both these cases, it is suitable to use a hard bonding agent, clamping or soldering to connect the reinforcing element 8 to the bearing points of the mount 4. Isostatic bearing of the reinforcing element 8 inside the mount 4 can also be provided.

In the theoretically likewise possible case of bearing by means of an annular blade or three fixed support points, a soft rubber bonding agent should be applied for decoupling the different coefficients of thermal expansion. The most suitable of the solutions known per se from other applications can be used for the bearing of the reinforcing element 8.

Furthermore, there are provided in the present case fastening elements 13 that act on the neutral fiber of the reinforcing element 8, that is to say at the region at which the least deformation of the reinforcing element 8 is to be expected.

In order to protect the fastening element 13 against the immersion medium 7 or against possible outgassings from the same, an additional seal or gasket 14 is provided between the mount 4 and the reinforcing element 8. This seal 14 can be arranged in such a way that contact of the same with the immersion medium 7 is avoided. In the present case, the seal 14 is designed in the form of a very thin diaphragm that is fashioned like a bellows and is bonded at bonding points 14a and 14b to the terminating element 5, on the one hand and to the fastening element 8, on the other hand, there being a requirement for the bonding points 14a and 14b to be located outside the immersion medium 7. The seal 14 serves as an additional protection in the case of a tight connection of the reinforcing element 8 to the mount 4, in particular where use is made of a soft rubber adhesive or cement. The seal 14 in the form of the diaphragm can be produced, for example, by electrodeposition of nickel on a mold. In this case, the seal 14 should be dimensioned such that as few deformations as possible are transferred onto the reinforcing element 8. The bonding points 14a and 14b provide a decoupling of the seal 14 in such a way that there is substantially no influence on the reinforcing element 8. Both the soft rubber adhesive for fastening the reinforcing element 8 in the mount 4, and that for fastening the seal 14 can possibly swell under the influence of moisture. It is therefore to be preferred to solder on the seal 14 and thus to keep moisture reliably away from the soft rubber adhesive.

Figure 2:
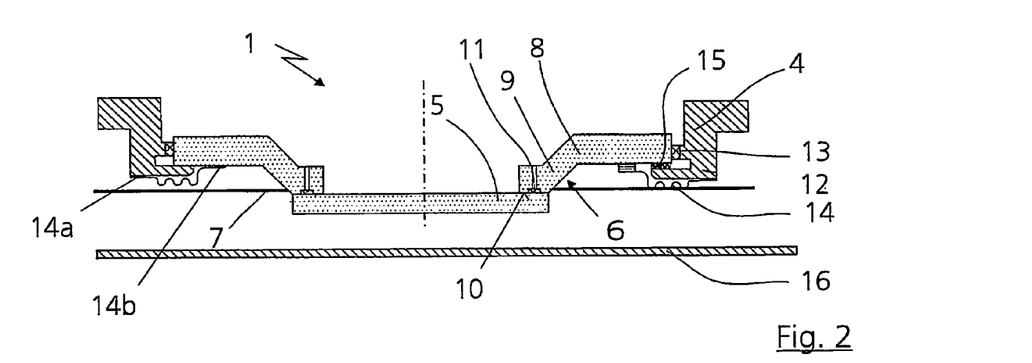
FIG. 2 shows a second embodiment of an objective according to the invention and having a holding device according to the invention.

In the case of the embodiment of the lithography objective 1 and the holding device 6 for holding the terminating element 5 in accordance with FIG. 2, instead of the elastic support points 12 a plurality of bonding points 15 are provided that permit additional fixing of the reinforcing element 8 inside the mount 4. Furthermore, a wafer 16 produced in a way known per se by means of the lithography objective 1 is illustrated in FIG. 2, and here the level of the immersion medium 7 exceeds the connection between the terminating element 5 and the reinforcing element 8.

Figure 3:
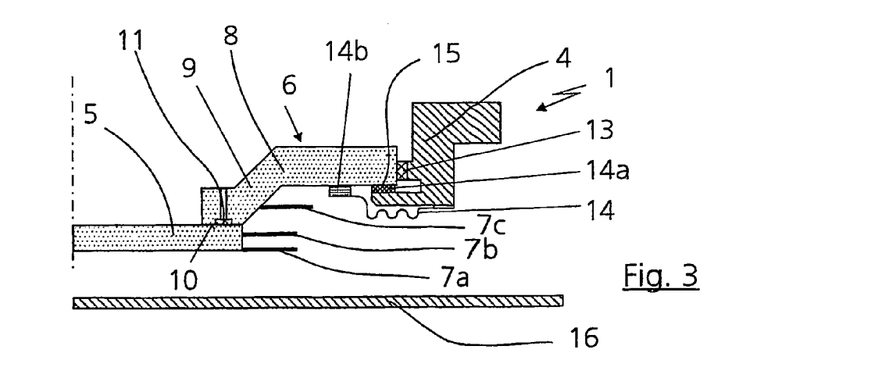
FIG. 3 shows the objective from FIG. 2 with different filling levels of immersion medium.

A plurality of filling levels of the immersion medium 7 are illustrated in FIG. 3, these being possible when using the lithography objective 1 in immersion lithography. The filling level or level 7a of the immersion medium is at the level of the lower optical surface of the terminating element 5, there being no need in this state for any special preparation relating to the tightness of the connection between the terminating element 5 and the reinforcing element 8, that is to say, for example, the wrung connection 10. A similar statement also holds for the immersion medium level 7b on the outer surface of the terminating element 5, it being necessary to note that with this level there is a high probability that the immersion medium 7 will reach into the region of the connection between the terminating element 5 and the reinforcing element 8 because of flow movements. Finally, in the case of the immersion medium level 7c the immersion medium 7 is located above the connection between the terminating element 5 and the reinforcing element 8, and so more stringent requirements are placed on the tightness of this connection. The possibilities of meeting these requirements have already been described, for example, with reference to the seal 11, as well as to the bonded and/or soldered connection. In addition, the mount 4, the terminating element 5 and the reinforcing element 8 can be protected against corrosive influences of the immersion medium 7 by a coating or a suitable chemical method.

Figure 4:
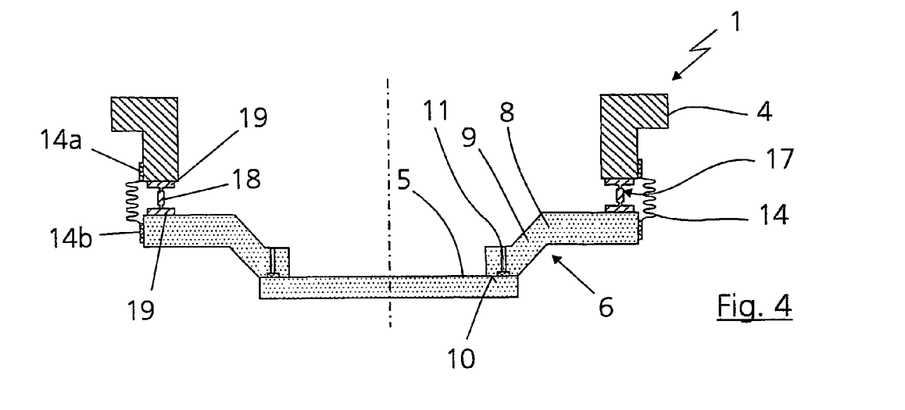
FIG. 4 shows a third embodiment of an objective according to the invention and having a holding device according to the invention.

In the embodiment of the lithography objective 1 and/or the holding device 6 in accordance with FIG. 4, the decoupling of the different coefficients of thermal expansion between the mount 4 and the reinforcing element 8 is accomplished by means of an elastic decoupling element 17. In the present embodiment, the elastic decoupling element 17 has a circumferential connecting ring 18 from which preferably in each case three coupling members 19 extend in the direction of the mount 4 and in the direction of the reinforcing element 8 and can, for example, be bonded to these two components. The coupling members 19 are designed in one piece with the connecting ring 18, and respectively form solid joints by means of which the decentering of the reinforcing element 8 can be set. Instead of connecting the coupling members 19 via the circumferential connecting ring 18, it is also possible to provide a plurality of individual, preferably three, elastic decoupling elements 17 around the circumference of the reinforcing element 8 and/or the mount 4. The decoupling elements 17 here form the isostatic bearing of the reinforcing element 8.

Figure 5:
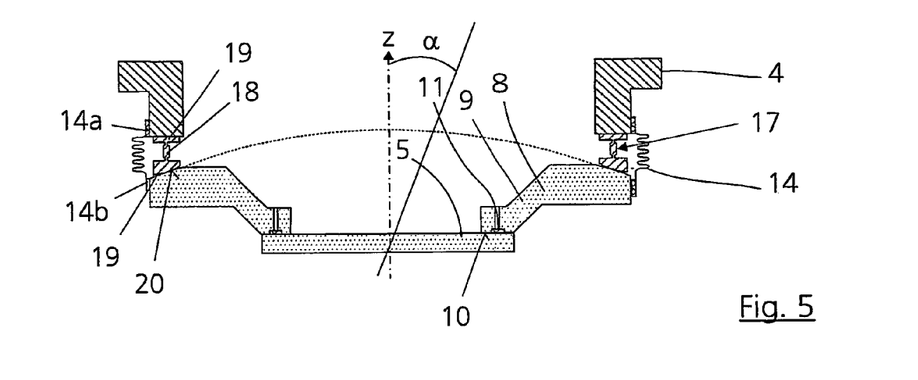
FIG. 5 shows a fourth embodiment of an objective according to the invention and having a holding device according to the invention.

In the case of all the above described embodiments of the lithography objective 1, it is possible to use manipulators (not illustrated) or disks ground to size to coordinate the axial position of the terminating element 5, that is to say the alignment along the optical axis (z-axis) as well as the so-called tilt. Illustrated in FIG. 5 is an embodiment of the lithography objective 1 and the holding device 6 that, in particular, simplifies the adjustment of the permissible tilt by the angle α. In this case, the reinforcing element 8 is provided on its side facing the mount 4, and thus the elastic decoupling element 17, with a spherical surface 20 or a radius. By displacing the mount 4 on the spherical surface 20 relative to the reinforcing element 8, the tilt of the reinforcing element 8, and thus also that of the terminating element 5, can be set to the desired value. This can be performed by means of the method, known per se, of so-called turning in. After setting of this value, it is possible to perform the bonding or soldering with the aid of a low-melting solder at the support point of the elastic decoupling element 17 on the reinforcing element 8. In addition, a radial decoupling (not illustrated) should be provided when use is made of a hard bonding agent.

A plurality of geometries of the wrung connection 10 between the terminating element 5 and the reinforcing element 8 are illustrated in FIGS. 6a, 6b and 6c. Both the terminating element 5 and the reinforcing element 8 respectively have flat surfaces in the case of the wrung connection 10 illustrated in FIG. 6a. In the design in accordance with FIG. 6b, the wringing surface of the terminating element 5 is convex, whereas the reinforcing element 8 is of concave design in this region. By contrast therewith, in the design in accordance with FIG. 6c the terminating element 5 is provided with a concave wringing surface, and the reinforcing element 8 with a convex wringing surface. Irrespective of whether the wringing surfaces are concave or convex surfaces, these can respectively be of spherical or aspheric design, in which case either both surfaces should be of spherical design, or both should be of aspheric design and should have an identical curvature with the aim of the best possible connection between the terminating element 5 and the reinforcing element 8.

Figure 7:
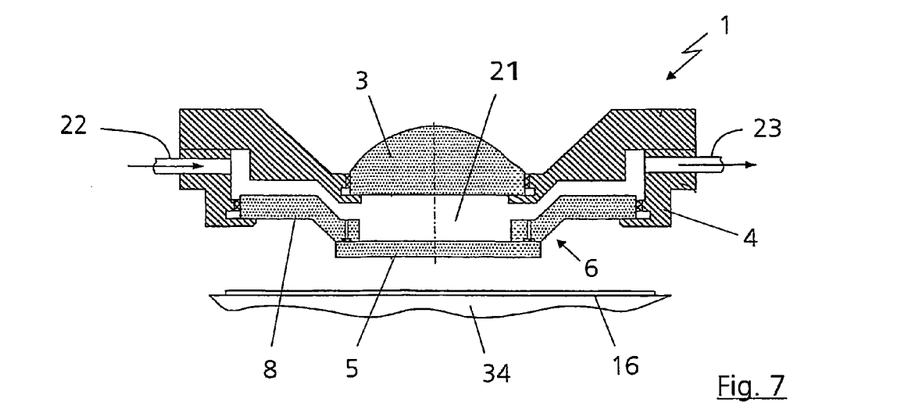
FIG. 7 shows a fifth embodiment of an objective according to the invention and having a holding device according to the invention.

In the case of the embodiment of the lithography objective 1 and the holding device 6 in accordance with FIG. 7, a space between the terminating element 5 and the optical element 3 arranged inside the lithography objective 1 can be purged with a preferably inert gas, for which reason this space is denoted below as gas space 21. For this purpose, a gas feed line 22 runs through the mount 4 into the gas space 21, and a gas removal line 23 leads outward from the gas space 21. It is possible in this way to minimize the risk that outgassing constituents of the immersion medium 7 can reach the gas space 21 between the terminating element 5 and the optical element 3—when use is made of water as immersion medium, in which case water vapor is involved. The pressure in the gas space 21 can be controlled in a way not described or illustrated in more detail. The gas space 21 can additionally also be purged with the immersion medium.

Figure 8:
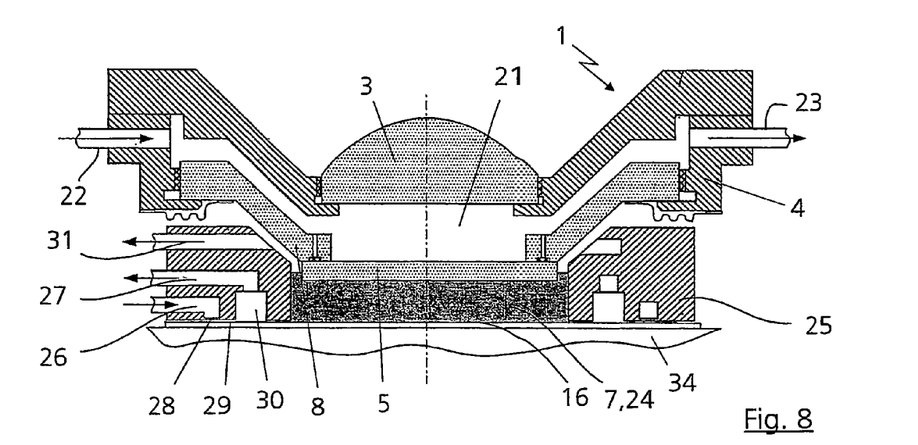
FIG. 8 shows a sixth embodiment of an objective according to the invention and having a holding device according to the invention.

The embodiment of the folding device 6 and of the lithography objective 1 in accordance with FIG. 8 exhibits an arrangement for purging an immersion medium space 24 that is bounded by a ring 25 and in which the immersion medium 7 is located. The ring 25 is provided in this case with a gas feed line 26 and with a gas extraction line 27, the gas extraction line 27 preferably being connected to a suction pump (not illustrated). Via the gas feed line 26, a gas is blown in the direction of the wafer 16 into a gas gap 29 via circularly arranged nozzles 28. Extraction of the gas via the gas extraction line 27 is performed via a groove 30 led in an annular fashion through the ring 25. A free movement of the ring 25 in relation to the wafer 16 is ensured in this way, and the immersion medium 7 is held in the immersion medium space 24 provided therefore. In order to be able to compensate position tolerances in the direction of the optical axis, as well as to enable pressure equalizing, the ring 25 is open upward in the direction of the terminating element 5, for which reason the outgassings of the immersion medium 7 are permanently extracted. This purpose is served by an extraction line 31 that is located above the filling level of the immersion medium 7. Of course, it would also be possible to integrate the extraction line 31 into the mount 4.

In a way not illustrated, it is possible for that region of the terminating element 5 which is located inside the immersion medium 7 to be designed for optimum flow in order not to generate vibrations inside the immersion medium space 24 during movement of the immersion medium 7.

Figure 9:
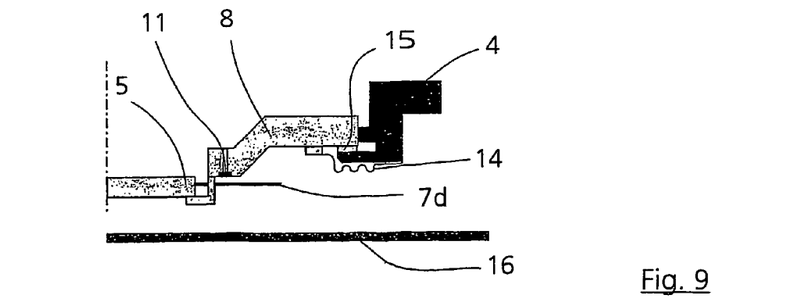
FIG. 9 shows a seventh embodiment of an objective according to the invention and having a holding device according to the invention.

When, in the case of the embodiment of the lithography objective 1 in accordance with FIG. 9, there is no need for a seal between the terminating element 5 and the reinforcing element 8, the filling level 7*d* of the immersion medium 7 resulting here can be controlled or regulated by the pressure inside the gas space 21.

Figure 10:
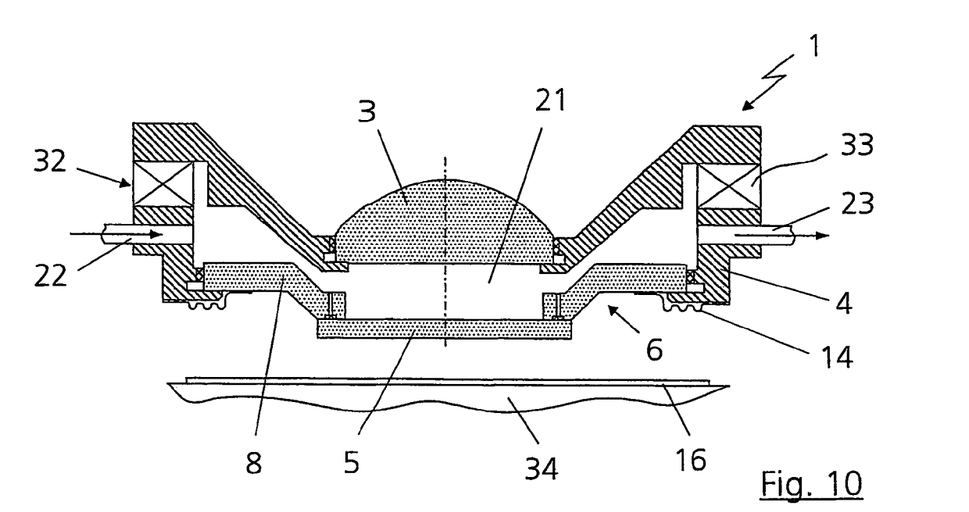
FIG. 10 shows an eighth embodiment of an objective according to the invention and having a holding device according to the invention.

Illustrated in FIG. 10 is a manipulation device 32 that permits the terminating element 5 to be displaced along the optical axis and in the plane perpendicular to the optical axis, and/or permits it to be tilted about an axis perpendicular to the optical axis. In the present case, for this purpose the manipulation device 32 has a plurality of actuators 33 distributed around the circumference of the housing 2 between the housing 2 and the mount 4. Said actuators can permit the above described displacement of the terminating element 5 in a way known per se. In addition, or as an alternative, a support plate 34 on which the wafer 16 rests can also be displaced and/or tilted in the directions specified above.

The actuators 33 can optionally be of controllable or regulable design, regulated actuators 33 presupposing an integrated sensor system. A measuring system (not illustrated) for determining the tilt and/or the decentering and/or the axial position of the terminating element 5 can be connected for this purpose to the manipulation device 32. Moreover, it is possible, for the purpose of regulating the tilt and/or the decentering and/or the axial position of the terminating element 5, to provide a closed-loop control circuit that has the manipulation device 32, the measuring system and a controlling system. Instead of the manipulation device 32, it is also possible to use spacers-known per se in order to set the axial position of the terminating element 5.

Figure 11:
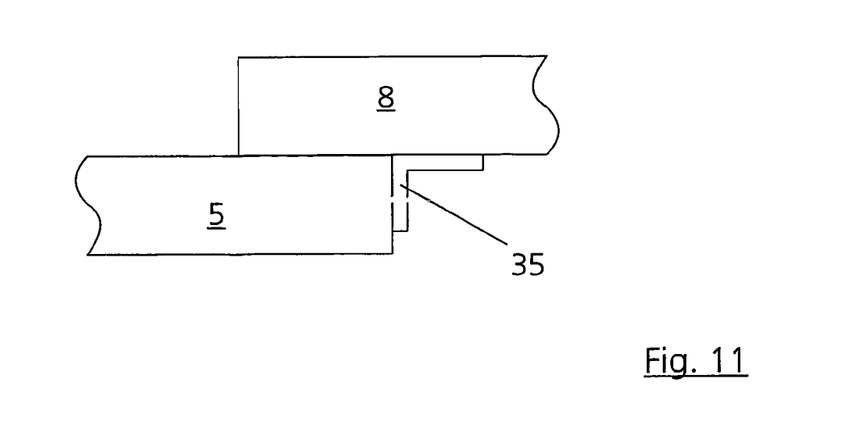
FIG. 11 shows a connection of an optical element to a reinforcing element in the case of which the optical element has a protective layer.

In the region in which the terminating element 5 and the reinforcing element 8 touch one another, as is to be seen in the enlarged illustration in accordance with FIG. 11, a protective layer 35 is provided both on the terminating element 5 and on the reinforcing element 8. This protective layer 35 is intended, firstly, to prevent the immersion medium 7 from loosening the wrung connection 10 between the terminating element 5 and the reinforcing element 8 and, secondly, to prevent the latter from coming into direct contact with the material of the terminating element 5 in the region of the wrung connection 10. It is possible in this way to prevent changes in fit owing to an otherwise possible incipient dissolution of the material of the terminating element 5, since at all the wavelengths of the laser radiation used the protective layer 35 ensures adequate protection of the wrung connection 10 of the terminating plate 5. If appropriate, the protective layer 35 could also be applied only to the terminating element 5 or to the reinforcing element 8, the shape of the terminating element 5 and of the reinforcing element 8 being immaterial.

For this purpose, the material of protective layers 35 should exhibit a poor water solubility and a good water impermeability or low water permeability, as well as having adhesive properties on the material of the terminating element 5, preferably on $CaF_2$ substrates. So-called sol-gel materials known from the general prior art come into consideration, in particular, as layer material, and these are formed mostly from organic solvent mixtures and adhere very effectively both on oxide and on fluoride layers. Possibilities for applying the sol-gel protective layers consist, inter alia, in spin coating, dip coating, spray-on coating and spread-coating. Of course, other methods could also be employed to apply the protective coatings 35 to the terminating element 5 and the reinforcing element 8. The methods described are types of applying the protective layers 35 that are very simple and quick and can be carried out with a low technical outlay by comparison with other coating methods. This holds, in particular, because of the complex geometry of the terminating element 5 and the reinforcing element 8 in the region of the wrung connection 10.

In addition to individual coating, it is also possible to apply layer systems consisting of a plurality of sol-gel individual layers, as long as the required properties are observed in relation to water solubility, water permeability and adhesive strength.

In order to avoid possible coating cracks, layer thicknesses of less than 1 μm are to be recommended. Since no specifications relating to transmission or reflection need be fulfilled, the protective layers 35 can be both transparent and absorbing.

Figure 12:
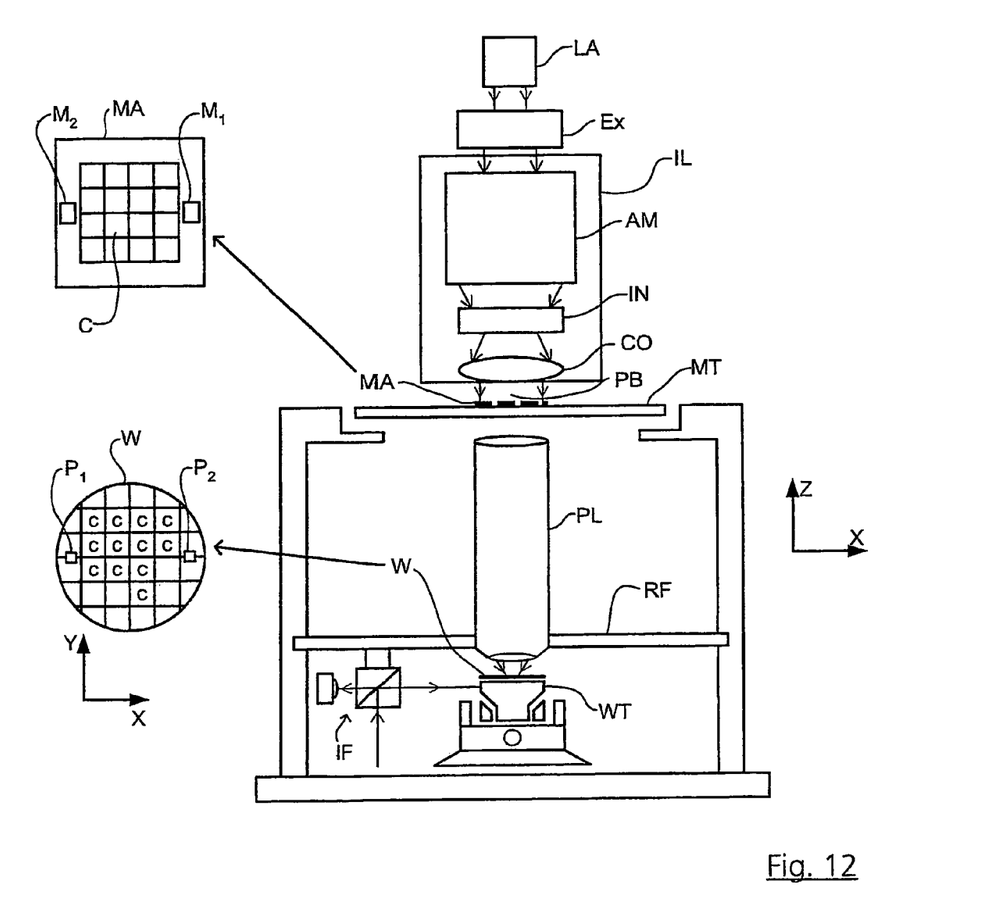
FIG. 12 shows a lithographic apparatus comprising an objective according to the invention.

FIG. 12 schematically depicts a lithographic apparatus according to a particular embodiment of the invention. The apparatus comprises: An illumination system (illuminator) IL for providing a projection beam PB of radiation (e.g. UV radiation); a first support structure (e.g. a mask table) MT for supporting patterning means (e.g. a mask) MA and connected to first positioning means for accurately positioning the patterning means with respect to item PL; a substrate table (e.g. a wafer table) WT for holding a substrate (e.g. a resist-coated wafer) W and connected to second positioning means for accurately positioning the substrate with respect to item PL; and a projection system (e.g. a refractive projection lens) PL for imaging a pattern imparted to the projection beam PB by patterning means MA onto a target portion C (e.g. comprising one or more dies) of the substrate W. The projection system PL comprises or consists of the objective 1 as described above.

As here depicted, the apparatus is of a transmissive type (e.g. employing a programmable mirror array of a type as referred to above). The illuminator IL receives a beam of radiation from a radiation source. The source and the lithographic apparatus may be separate entities, for example when the source is an excimer laser. In such cases, the source is not considered to form part of the lithographic apparatus and the radiation beam is passed from the source to the illuminator IL with the aid of a beam delivery system comprising for example suitable directing mirrors and/or a beam expander. In other cases the source may be integral part of the apparatus, for example when the source is a mercury lamp. The source and the illuminator IL, together with the beam delivery system if required, may be referred to as a radiation system.

The invention claimed is:

1. A holding device for an optical element in an objective having a mount that is connected to the objective and at least indirectly to the optical element, there being arranged between the mount and the optical element a reinforcing element whose coefficient of thermal expansion corresponds substantially to the coefficient of thermal expansion of the optical element;
   the reinforcing element is positioned outside the optical path of the optical element;
   wherein the holding device seals the objective from a fluid entering the objective; and
   wherein the reinforcing element is coated with a material to prevent corrosive effects from the fluid.

2. The holding device as claimed in claim 1, wherein a seal or gasket is arranged between the optical element and the reinforcing element.

3. The holding device as claimed in claim 2, wherein the reinforcing element and the optical element are composed of the same material.

4. The holding device as claimed in claim 2, wherein the optical element and the reinforcing element are connected to one another by a wrung connection.

5. The holding device as claimed in claim 2, wherein the optical element and the reinforcing element are connected to one another by bonding.

6. The holding device as claimed in claim 2, wherein a seal or gasket is arranged between the mount and the reinforcing element.

7. The holding device as claimed in claim 2, wherein the optical element is designed as a terminating element.

8. The holding device as claimed in claim 1, wherein the reinforcing element and the optical element are composed of the same material.

9. The holding device as claimed in claim 8, wherein the reinforcing element and the optical element consist of $SiO_2$.

10. The holding device as claimed in claim 8, wherein the reinforcing element and the optical element consist of $CaF_2$.

11. The holding device as claimed in claim 8, wherein the optical element and the reinforcing element are connected to one another by a wrung connection.

12. The holding device as claimed in claim 1, wherein the optical element and the reinforcing element are connected to one another by a wrung connection.

13. The holding device as claimed in claim 12, wherein the optical element and the reinforcing element in each case have substantially flat surfaces in the region of the wrung connection.

14. The holding device as claimed in claim 12, wherein the optical element and the reinforcing element in each case have spherical surfaces in the region of the wrung connection.

15. The holding device as claimed in claim 12, wherein the optical element and the reinforcing element in each case have aspheric surfaces in the region of the wrung connection.

16. The holding device as claimed in claim 12, wherein the optical element and/or the reinforcing element are provided with a protective layer in the region of the wrung connection.

17. The holding device as claimed in claim 16, wherein the protective layer is formed by sol-gel materials.

18. The holding device as claimed in claim 12, wherein the optical element and/or the reinforcing element are provided with a protective layer in the region of the wrung connection and wherein a seal or gasket is arranged between the optical element and the reinforcing element.

19. The holding device as claimed in claim 1, wherein the optical element and the reinforcing element are connected to one another by bonding.

20. The holding device as claimed in claim 1, wherein the optical element and the reinforcing element are connected to one another by bonding and wherein the optical element and/or the reinforcing element are provided with a protective layer in the region of the bonding connection.

21. The holding device as claimed in claim 1, wherein the optical element and the reinforcing element are connected to one another by soldering.

22. The holding device as claimed in claim 1, wherein the optical element and the reinforcing element are connected to one another by soldering and wherein the optical element and/or the reinforcing element are provided with a protective layer in the region of the soldering connection.

23. The holding device as claimed in claim 1, wherein the optical element and the reinforcing element are designed in one piece with one another.

24. The holding device as claimed in claim 1, wherein a seal or gasket is arranged between the mount and the reinforcing element.

25. The holding device as claimed in claim 24, wherein the seal or gasket is arranged in such a way that contact between the same and an immersion medium is avoided.

26. The holding device as claimed in claim 24, wherein the reinforcing element is fitted on the mount by a plurality of fastening elements.

27. The holding device as claimed in claim 24, wherein at least one elastic decoupling element is arranged between the mount and the reinforcing element.

28. The holding device as claimed in claim 1, wherein the reinforcing element is held inside the mount by an isostatic bearing.

29. The holding device as claimed in claim 28, wherein the isostatic bearing has a plurality of, preferably three, elastic support points between the reinforcing element and the mount.

30. The holding device as claimed in claim 1, wherein the reinforcing element is fitted on the mount by a plurality of fastening elements.

31. The holding device as claimed in claim 30, wherein the fastening elements act on a neutral fiber of the reinforcing element.

32. The holding device as claimed in claim 1, wherein at least one elastic decoupling element is arranged between the mount and the reinforcing element.

33. The holding device as claimed in claim 27, wherein the elastic decoupling element has a plurality of coupling members that rest on a spherical surface of the reinforcing element.

34. The holding device as claimed in claim 1, wherein the optical element is designed as a terminating element.

35. The holding device as claimed in claim 1, wherein the reinforcing element comprises an aperture.

36. The holding device as claimed in claim 1, wherein the reinforcing element comprises a structure configured as a ring.

37. The holding device as claimed in claim 1 further comprising:
   a connecting device between the reinforcing element and the optical element; and
   a seal or gasket between the reinforcing element and the optical element.

38. The holding device as claimed in claim 1, wherein the fluid comprises a liquid or gas.

39. The holding device as claimed in claim 1, further comprising a fastening element between the mount and the reinforcing element, the fastening element secured to the reinforcing element at a region of the reinforcing having the least thermal deformation.

40. The holding device as claimed in claim 1, wherein said objective is an immersion lithography objective.

41. The holding device as claimed in claim 40, wherein provided between the optical element and an optical element arranged inside the lithography objective are a feed line for gas or immersion medium, and a removal line for gas or immersion medium.

42. The holding device as claimed in claim 40, wherein provided between the optical element and an immersion medium are a gas feed line and a gas extraction line to and from an immersion medium space.

43. The holding device as claimed in claim 40, wherein provided between the optical element and an immersion medium are a gas feed line and a gas extraction line to and from an immersion medium space.

44. The holding device as claimed in claim 40, wherein a manipulation device is provided by means of which the optical element can be displaced along an optical axis and/or in a plane perpendicular to the optical axis, and/or can be tilted about an axis perpendicular to the optical axis.

45. The holding device as claimed in claim 44, wherein a measuring system for determining the tilt and/or the decentering and/or the axial position of the optical element is connected to the manipulation device.

46. The holding device as claimed in claim 45, wherein a control loop for controlling the tilt and/or the decentering and/or the axial position of the optical element is provided which has the manipulation device, the measuring system and a control device.

47. The holding device as claimed in claim 40, wherein a manipulation device is provided by means of which the optical element can be displaced along an optical axis and/or in a plane perpendicular to the optical axis, and/or can be tilted about an axis perpendicular to the optical axis.

48. The holding device as claimed in claim 1, wherein the objective comprises an immersion lithography objective and wherein the optical element comprises a first optical element subjected to a first immersion medium, the immersion lithography objective further comprising:
   a second optical element;
   a feed line for a second immersion medium; and
   a removal line for the second immersion medium.

49. The holding device as claimed in claim 48, wherein:
   the feed line is arranged between the first and second optical elements; and
   the removal line is arranged between the first and second optical elements.

50. The holding device as claimed in claim 48, wherein a manipulation device is provided by means of which the optical element can be displaced along an optical axis and/or in a plane perpendicular to the optical axis, and/or can be tilted about an axis perpendicular to the optical axis.

51. The holding device as claimed in claim 50, wherein a measuring system for determining the tilt and/or the decentering and/or the axial position of the optical element is connected to the manipulation device.

52. The holding device as claimed in claim 51, wherein a control loop for controlling the tilt and/or the decentering and/or the axial position of the optical element is provided which has the manipulation device, the measuring system and a control device.

53. The holding device as claimed in claim 1 comprising an immersion projection exposure apparatus.

54. An objective having an optical element and having a holding device for the optical element having a mount, the mount is connected to the objective and at least indirectly to the optical element, there being arranged between the mount and the optical element a reinforcing element; and
   a seal positioned between the optical element and the reinforcing element, the seal comprising a coefficient of thermal expansion that corresponds substantially to the coefficient of thermal expansion of the reinforcing element.

55. The objective as claimed in claim 54, which is designed as a lithography objective.

56. The objective as claimed in claim 55, said objective being an immersion lithography objective.

57. The objective as claimed in claim 56, wherein provided between the optical element and an optical element arranged inside the lithography objective are a feed line for gas or immersion medium, and a removal line for gas or immersion medium.

58. The objective as claimed in claim 57, wherein provided between the optical element and an immersion medium are a gas feed line and a gas extraction line to and from an immersion medium space.

59. The objective as claimed in claim 57, wherein a manipulation device is provided by means of which the optical element can be displaced along an optical axis and/or in a plane perpendicular to the optical axis, and/or can be tilted about an axis perpendicular to the optical axis.

60. The objective as claimed in claim 56, wherein provided between the optical element and an immersion medium are a gas feed line and a gas extraction line to and from an immersion medium space.

61. The objective as claimed in claim 60, wherein a manipulation device is provided by means of which the optical element can be displaced along an optical axis and/or in a plane perpendicular to the optical axis, and/or can be tilted about an axis perpendicular to the optical axis.

62. The objective as claimed in claim 56, wherein a manipulation device is provided by means of which the optical element can be displaced along an optical axis and/or in a plane perpendicular to the optical axis, and/or can be tilted about an axis perpendicular to the optical axis.

63. The objective as claimed in claim 56, wherein a measuring system for determining the tilt and/or the decentering and/or the axial position of the optical element is connected to the manipulation device.

64. The objective as claimed in claim 63, wherein a control loop for controlling the tilt and/or the decentering and/or the axial position of the optical element is provided which has the manipulation device, the measuring system and a control device.

65. The objective as claimed in claim 55, wherein a manipulation device is provided by means of which the optical element can be displaced along an optical axis and/or in a plane perpendicular to the optical axis, and/or can be tilted about an axis perpendicular to the optical axis.

66. The objective as claimed in claim 54, wherein a manipulation device is provided by means of which the optical element can be displaced along an optical axis and/or in a plane perpendicular to the optical axis, and/or can be tilted about an axis perpendicular to the optical axis.

67. The objective as claimed in claim 54, wherein the seal comprises a discrete structure, the discrete structure comprising at least one of a sealing ring and a gasket.

68. The objective as claimed in claim 54, wherein the seal provides an air-tight seal for the objective.

69. The objective as claimed in claim 54, wherein the coefficient of thermal expansion of the seal corresponds substantially to both of the coefficient of thermal expansion of the optical element and the coefficient of thermal expansion of the reinforcing element.

70. A holding device for an optical element in an objective having a mount, the holding device comprising a reinforcing element arranged between the mount and the optical element, the reinforcing element comprising:
   a coefficient of thermal expansion that corresponds substantially to the coefficient of thermal expansion of the optical element;
   a connecting device between the reinforcing element and the optical element;
   a seal or gasket between the reinforcing element and the optical element; and
   wherein the reinforcing element comprises the same material as the seal or gasket.

71. The holding device as claimed in claim 70, wherein the connecting device comprises a wrung connection.

72. The holding device as claimed in claim 70 comprising an immersion projection exposure apparatus.

73. The holding device as claimed in claim 70, wherein said objective is an immersion lithography objective.

74. The holding device as claimed in claim 73, wherein provided between the optical element and an optical element arranged inside the lithography objective are a feed line for gas or immersion medium, and a removal line for gas or immersion medium.

75. The holding device as claimed in claim 72, wherein provided between the optical element and an immersion medium are a gas feed line and a gas extraction line to and from an immersion medium space.

76. The holding device as claimed in claim 73, wherein provided between the optical element and an immersion medium are a gas feed line and a gas extraction line to and from an immersion medium space.

77. The holding device as claims in claim 72, wherein a manipulation device is provided by means of which the optical element can be displaced along an optical axis and/or in a plane perpendicular to the optical axis, and/or can be tilted about an axis perpendicular to the optical axis.

78. The holding device as claimed in claim 77, wherein a measuring system for determining the tilt and/or the decentering and/or the axial position of the optical element is connected to the manipulation device.

79. The holding device as claimed in claim 78, wherein a control loop for controlling the tilt and/or the decentering and/or the axial position of the optical element is provided which has the manipulation device, the measuring system and a control device.

80. The holding device as claimed in claim 73, wherein a manipulation device is provided by means of which the optical element can be displaced along an optical axis and/or in a plane perpendicular to the optical axis, and/or can be tilted about an axis perpendicular to the optical axis.

81. The holding device as claimed in claim 70, wherein the objective comprises an immersion lithography objective and wherein the optical element comprises a first optical element subjected to a first immersion medium, the immersion lithography objective further comprising:
   a second optical element;
   a feed line for a second immersion medium; and
   a removal line for the second immersion medium.

* * * * *

UNITED STATES PATENT AND TRADEMARK OFFICE
CERTIFICATE OF CORRECTION

PATENT NO.       : 8,854,602 B2                                    Page 1 of 3
APPLICATION NO.  : 10/580179
DATED            : October 7, 2014
INVENTOR(S)      : Bernhard Gellrich et al.

It is certified that error appears in the above-identified patent and that said Letters Patent is hereby corrected as shown below:

On the title page

Delete the Title page and substitute therefore the attached title page shown the corrected number of claims Please insert item (63) below the Prior Publication Data paragraph on first page as follows:

--Related U.S. Application Data:

U.S. Application Serial No. 10/719,683  Nov. 24, 2003--

In the specification

Column 4, line 22: Replace "in claim 24." with --in various exemplary embodiments of the inventions.--

Column 4, line 23: Replace "In claim 32" with --In various exemplary embodiments of the inventions, a--

Column 4, line 40: Replace "emerges from claim 33." with --is disclosed in various exemplary embodiments of the inventions.--

Column 4, line 42-43: Replace "according to claim 32 is given in claim 38." with --is disclosed in exemplary embodiments of the inventions.--

Column 9, line 25: Replace "the folding device" with --the holding device--

Column 10, line 15: Replace "spacers-known" with --spacers known--

Signed and Sealed this
Twenty-first Day of June, 2016

Michelle K. Lee
*Director of the United States Patent and Trademark Office*

CERTIFICATE OF CORRECTION (continued)
U.S. Pat. No. 8,854,602 B2

In the claims

Column 13, line 7 (Claim 33): Replace "in claim 27," with --in claim 32,--

Column 13, lines 38-41 (Claim 42): Delete claim 42 located at column 13, lines 38-41 since redundant with claim 43 located at column 13, lines 42-45

Column 16, line 19: Replace "as claims in claim" with --as claimed in claim--

(12) United States Patent
Gellrich et al.

(10) Patent No.: US 8,854,602 B2
(45) Date of Patent: Oct. 7, 2014

(54) HOLDING DEVICE FOR AN OPTICAL ELEMENT IN AN OBJECTIVE

(75) Inventors: Bernhard Gellrich, Aalen (DE); Andreas Wurmbrand, Aalen-Reichenbach (DE); Jens Kugler, Heubach (DE); Armin Schoeppach, Aalen (DE); Christian Zengerling, Muehlhausen (DE); Stephane Bruynooghe, Aalen (DE)

(73) Assignees: ASML Netherlands B.V., Veldhoven, NB (NL); Carl Zeiss SMT GmbH, Oberkochen (DE)

( * ) Notice: Subject to any disclaimer, the term of this patent is extended or adjusted under 35 U.S.C. 154(b) by 2140 days.

(21) Appl. No.: 10/580,179

(22) PCT Filed: Nov. 22, 2004

(86) PCT No.: PCT/EP2004/013228
§ 371 (c)(1),
(2), (4) Date: Apr. 24, 2007

(87) PCT Pub. No.: WO2005/054953
PCT Pub. Date: Jun. 16, 2005

(65) Prior Publication Data
US 2008/0002170 A1  Jan. 3, 2008

(30) Foreign Application Priority Data
Dec. 2, 2003 (DE) .................. 103 56 730

(51) Int. Cl.
G03B 27/54 (2006.01)
G03B 27/68 (2006.01)
G03F 7/20 (2006.01)
G03B 27/52 (2006.01)
G03B 27/42 (2006.01)

(52) U.S. Cl.
CPC ........ *G03F 7/70891* (2013.01); *G03F 7/70808* (2013.01); *G03F 7/70341* (2013.01); *G03F 7/70825* (2013.01)
USPC ............... 355/67; 355/30; 355/52; 355/53

(58) Field of Classification Search
USPC ........ 355/30, 53, 67–71, 77, 52, 55; 359/808, 359/811, 818, 819, 820; 250/492.1, 492.2, 250/492.22, 548
See application file for complete search history.

(56) References Cited

U.S. PATENT DOCUMENTS

| | | | |
|---|---|---|---|
| 4,433,897 A * | 2/1984 | Kojima et al. | 359/830 |
| 4,725,126 A * | 2/1988 | Siga et al. | 359/819 |
| 4,983,251 A | 1/1991 | Haisma | 156/630 |
| 5,054,683 A | 10/1991 | Haisma | 228/198 |

(Continued)

FOREIGN PATENT DOCUMENTS

| | | |
|---|---|---|
| CH | 663674 A5 * | 12/1987 |
| DE | 10200243 | 7/2003 |

(Continued)

*Primary Examiner* — Toan Ton
*Assistant Examiner* — Christina Riddle
(74) *Attorney, Agent, or Firm* — Wells St. John P.S.

(57) ABSTRACT

A holding device for an optical element in an objective has a mount that is connected to the objective, on the one hand, and at least indirectly to the optical element, on the other hand. Arranged between the mount and the optical element is a reinforcing element whose coefficient of thermal expansion corresponds substantially to the coefficient of thermal expansion of the optical element.

80 Claims, 5 Drawing Sheets